United States Patent
Buzi et al.

(10) Patent No.: US 12,329,044 B2
(45) Date of Patent: Jun. 10, 2025

(54) APPLYING INERT ION BEAM ETCHING FOR IMPROVING A PROFILE AND REPAIRING SIDEWALL DAMAGE FOR PHASE CHANGE MEMORY DEVICES

(71) Applicant: International Business Machines Corporation, Armonk, NY (US)

(72) Inventors: Luxherta Buzi, Yorktown Heights, NY (US); Thitima Suwannasiri, Oak Ridge, NJ (US); Lynne Marie Gignac, Beacon, NY (US); Robert L. Bruce, White Plains, NY (US); Sebastian Ulrich Engelmann, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 686 days.

(21) Appl. No.: 17/456,402

(22) Filed: Nov. 24, 2021

(65) Prior Publication Data
US 2023/0165169 A1 May 25, 2023

(51) Int. Cl.
| | |
|---|---|
| *H01L 45/00* | (2006.01) |
| *H10B 63/00* | (2023.01) |
| *H10N 70/00* | (2023.01) |
| *H10N 70/20* | (2023.01) |

(52) U.S. Cl.
CPC ........... *H10N 70/231* (2023.02); *H10B 63/80* (2023.02); *H10N 70/063* (2023.02); *H10N 70/882* (2023.02)

(58) Field of Classification Search
CPC .. H10N 70/231; H10N 70/063; H10N 70/882; H10B 63/80
See application file for complete search history.

(56) References Cited

U.S. PATENT DOCUMENTS

| | | | |
|---|---|---|---|
| 9,166,154 B2 | 10/2015 | Satoh | |
| 9,269,893 B2 | 2/2016 | Lu | |
| 9,660,177 B2 | 5/2017 | Annapragada | |
| 9,871,195 B1 | 1/2018 | Yang | |
| 10,043,851 B1 | 8/2018 | Shen | |
| 10,115,893 B2 | 10/2018 | Park | |

(Continued)

OTHER PUBLICATIONS

Ambrogio et al., "Equivalent-accuracy accelerated neural-network training using analogue memory", Published Jun. 6, 2018, Nature, vol. 558, 13 pages.

(Continued)

*Primary Examiner* — Dale E Page
*Assistant Examiner* — Colleen E Snow
(74) *Attorney, Agent, or Firm* — Edward J. Wixted, III

(57) ABSTRACT

A process of improving a profile and repairing sidewall damage for phase change memory devices. The process includes applying inert ion beam etching to trim a sidewall of a layer of phase change memory material in a phase change memory device, where the sidewall has been damaged in reactive ion etching using halogens. In the process, the inert ion beam etching is with low energy. In the process, applying the inert ion beam etching to trim the sidewall is at a predetermined low temperature. In the process, applying the inert ion beam etching to trim the sidewall is at a predetermined small angle between an inert ion beam and a surface tangent of the sidewall.

18 Claims, 4 Drawing Sheets

(56) References Cited

U.S. PATENT DOCUMENTS

| | | | |
|---|---|---|---|
| 10,276,788 B2 | 4/2019 | Lee | |
| 10,446,743 B2 | 10/2019 | Li | |
| 10,516,101 B2 | 12/2019 | Wang | |
| 11,183,215 B1* | 11/2021 | Zhao | B81C 1/00111 |
| 2015/0104882 A1* | 4/2015 | Jung | H10B 61/00 |
| | | | 438/3 |
| 2017/0294578 A1* | 10/2017 | BrightSky | H10B 63/80 |
| 2021/0296580 A1* | 9/2021 | Shen | H10N 70/231 |

OTHER PUBLICATIONS

De Bastiani et al., "Amorphization kinetics of Ge2Sb2Te5 thin film induced by ion implantation", Nuclear Instruments and Methods in Physics Research B 257 (2007), 5 pages.

Li et al., "Direct evidence of reactive ion etching induced damages in Ge2Sb2Te5 based on different halogen plasmas", Applied Surface Science 378 : 163-166. Elsevier Science BV. (Aug. 15, 2016), 4 pages.

Tsai et al., "Recent progress in analog memory-based with accelerators for deep learning", Journal of Physics D: Applied Physics, vol. 51, (2018), 28 pages.

Washington et al., "Characterizing the effects of etch-induced material modification on the crystallization properties of nitrogen doped Ge2Sb2Te5", Journal of Applied Physics, vol. 109, 034502 (2011), 7 pages.

* cited by examiner

APPLYING INERT ION BEAM ETCHING FOR IMPROVING A PROFILE AND REPAIRING SIDEWALL DAMAGE FOR PHASE CHANGE MEMORY DEVICES

BACKGROUND

The present invention relates generally to phase change memory devices, and more particularly to applying inert ion beam etching for improving a profile and repairing sidewall damage for phase change memory devices.

Phase change memory (PCM) material damage, such as grain coarsening and selective material depletion etc., has effects on PCM device performance (i.e., switching times). Mitigation of reactive-ion etching (RIE) caused damage is a key for improving PCM device performance. For example, halogen etching of chalcogenide materials creates about 25 nanometers of a damaged sidewall layer which is with dense, large grained germanium-antimony-tellurium layer (GST) and depletion of germanium (Ge) and antimony (Sb). This damaged structure may cause further damage during high temperature post-processing. Control of the damaged layer is critical when the scalability of the critical dimension (CD) is 20 nanometers or lower.

SUMMARY

In one aspect, a process of improving a profile and repairing sidewall damage for phase change memory devices is provided. The process includes applying inert ion beam etching to trim a sidewall of a layer of phase change memory material in a phase change memory device, where the sidewall has been damaged in reactive ion etching using halogens. In the process, the inert ion beam etching is with low energy. In the process, applying the inert ion beam etching is at a predetermined low temperature. In the process, applying the inert ion beam etching is at a predetermined small angle between an inert ion beam and a surface tangent of the sidewall.

In another aspect, a phase change memory device is provided. The phase change memory device includes a layer of phase change memory material with a repaired sidewall generated by applying inert ion beam etching to trim a damaged sidewall. The damaged sidewall has been generated in reactive ion etching using halogens. In the phase change memory device, elemental composition of a bulk of phase change memory and an ovonic threshold switch is maintained in the inert ion beam etching. In the phase change memory device, elemental composition of the repaired sidewall is maintained in the inert ion beam etching. In the repaired sidewall, sputter redeposition from the reactive ion etching is removed by the inert ion beam etching. In the repaired sidewall, metal redeposition from the reactive ion etching is removed by the inert ion beam etching.

DETAILED DESCRIPTION

In the present invention, inert ion beam etching (IBE), for example argon (Ar) ion beam etching, is applied for a damaged sidewall (about 20-25 nanometers) of a phase change memory (PCM) device, where the damaged sidewall is created during post-halogen reactive-ion etching (RIE). After the inert ion beam etching (IBE), the elemental composition of the bulk and the sidewall of the PCM device is maintained. Applying the inert ion beam etching (IBE) to trim the damaged sidewall removes sputter redeposition from the previous RIE process. Applying the inert ion beam etching (IBE) to trim the damaged sidewall helps remove redeposition of metals, for example tungsten (W), from the bottom electrode. The metal redeposition may short across the PCM and the ovonic threshold switch (OTS), and thus applying the inert ion beam etching (IBE) to trim the damaged sidewall prevents intermixing between PCM and OTS and improves adhesion of encapsulation while using highly diluted or inert RIE chemistries that minimizes PCM and OTS damage.

A process of inert ion beam etching (IBE) can be applied on a patterned substrate where one of the etching targets is a PCM material layer, for example a germanium-antimony-tellurium layer (GST) layer. Before patterning a soft mask, for example, a typical stack may include metal as the bottom electrode (BE)|~100 nm doped GST|TiN as the top electrode (TE)|SiN as the hard mask (HM)|organic planarization layer (OPL)|low temperature oxide (LTO)|anti-reflective coating (ARC).

Figure 1:
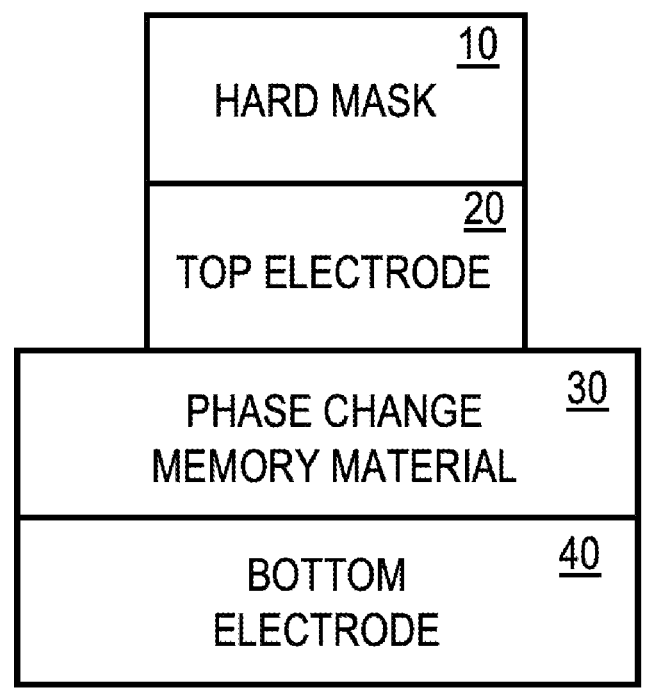
FIG. 1 is a diagram illustrating a stack after patterning a soft mask, in accordance with one embodiment of the present invention.

FIG. 1 is a diagram illustrating a stack after patterning a soft mask, in accordance with one embodiment of the present invention. As shown in FIG. 1, the stack include a layer of hard mask (HM) 10, a layer of top electrode (TE) 20, a layer of phase change memory material (PCM) 30, and a layer of bottom electrode (BE) 40. The layer of PCM 30 may be a layer of GST (e.g., $Ge_2Sb_2Te_5$), a layer of silicon oxide doped GST, a layer of nitrogen doped GST, a layer if silicon oxide doped GaSbGe (gallium-antimony-germanium), or a layer of other phase change memory materials.

Figure 2:
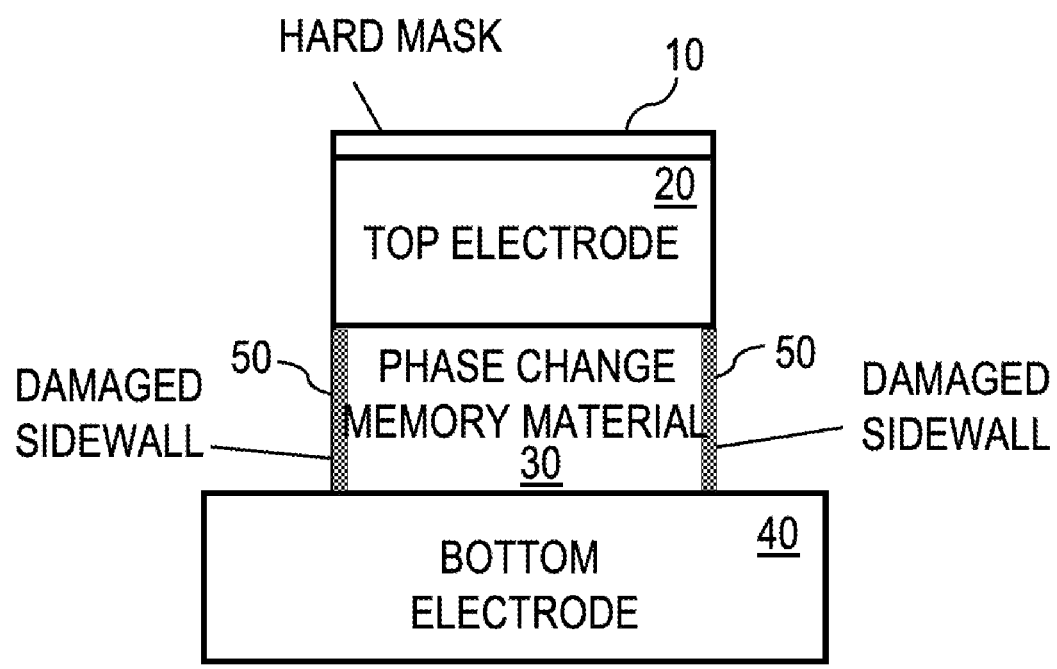
FIG. 2 is a diagram illustrating sidewall damage of a phase change memory (PCM) material layer after reactive-ion etching (RIE), in accordance with one embodiment of the present invention.

After patterning the soft mask and when the PCM material layer (e.g., GST) in the stack is reached, the reactive ion etching (RIE) using halogens (e.g., $Cl_2$, $CHF_3$, HBr, $CF_4$, and hydrofluorocarbons) is processed. FIG. 2 is a diagram illustrating sidewall damage of a phase change memory (PCM) material layer after reactive-ion etching (RIE), in accordance with one embodiment of the present invention. As shown in FIG. 2, the stack still include a thinner layer of hard mask (HM) 10, a layer of top electrode (TE) 20, a layer of phase change memory material (PCM) 30, and a layer bottom electrode (BE) 40; Through the process of the reactive ion etching (RIE) using halogens, the sidewall of the layer of phase change memory material (PCM) 30 is damaged. FIG. 2 shows RIE damaged sidewall 50 of the layer of phase change memory material (PCM) 30.

Figure 3:
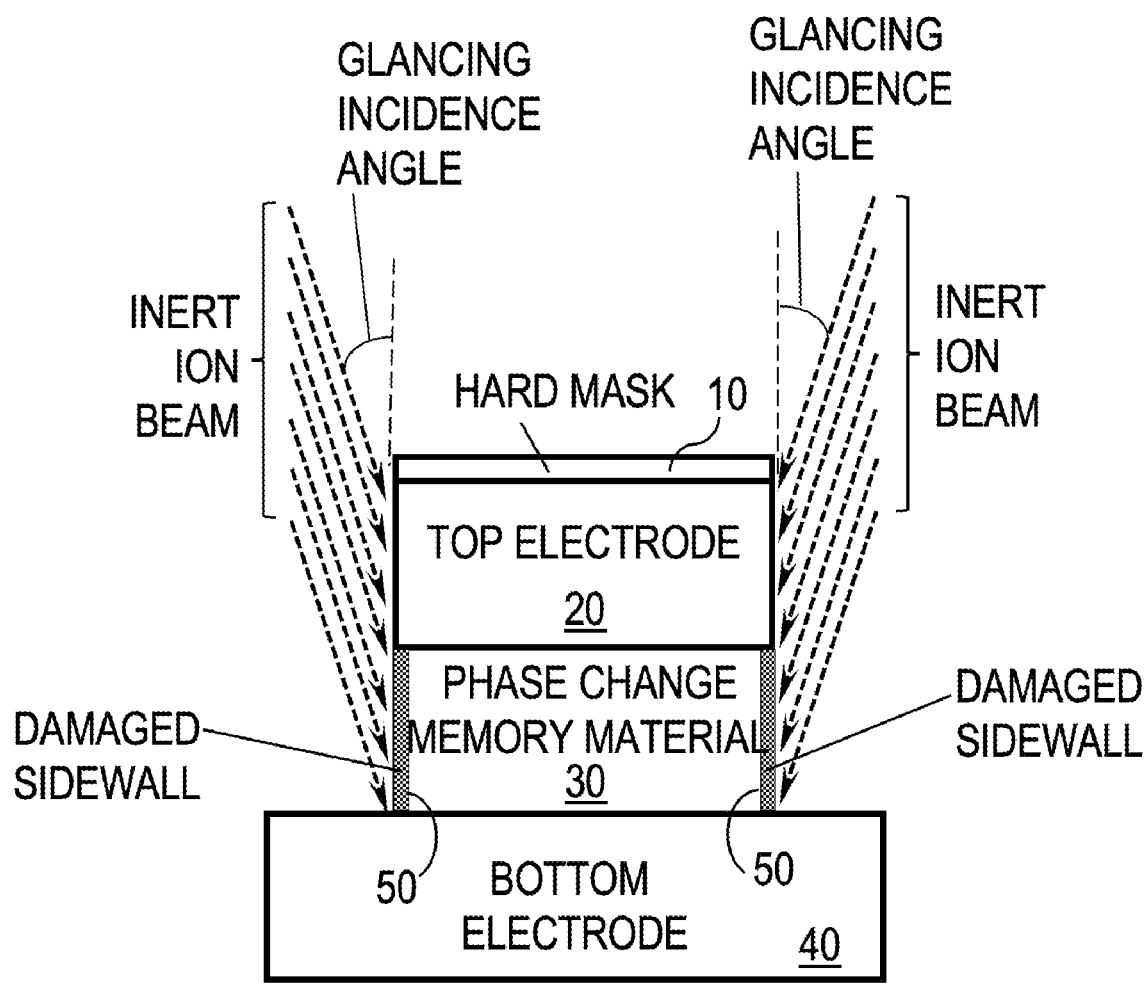
FIG. 3 is a diagram illustrating application of inert ion beam etching for repairing an RIE damaged sidewall of a phase change memory (PCM) material layer, in accordance with one embodiment of the present invention.

In the present invention, inert ion beam etching (IBE) is applied for repairing damaged sidewall 50 of the layer of phase change memory material (PCM) 30. FIG. 3 is a diagram illustrating application of inert ion beam etching (IBE) for repairing RIE damaged sidewall 50 of the layer of phase change memory material (PCM) 30, in accordance with one embodiment of the present invention. The inert ion beam etching (IBE) with low energy (60-200 volts) is applied at a small glancing incidence angle. The glancing incidence angle is an angle between the inert ion beam and the surface tangent of damaged sidewall 50. The small glancing incidence angle is substantially 10 degrees (~10°) or less than 10 degrees (<10°). The inert ion beam etching (IBE) is applied at a predetermined low temperature, ranging from 25° C. to 250° C. In one embodiment, an argon (Ar) ion beam is used in the inert ion beam etching to trim RIE damaged sidewall 50. In another embodiment, a neon (Ne) ion beam is used in the inert ion beam etching to trim RIE damaged sidewall 50. In yet another embodiment, a krypton (Kr) ion beam is used in the inert ion beam etching to trim RIE damaged sidewall 50. In yet another embodiment, a xenon (Xe) ion beam is used in the inert ion beam etching to trim RIE damaged sidewall 50.

Figure 4:
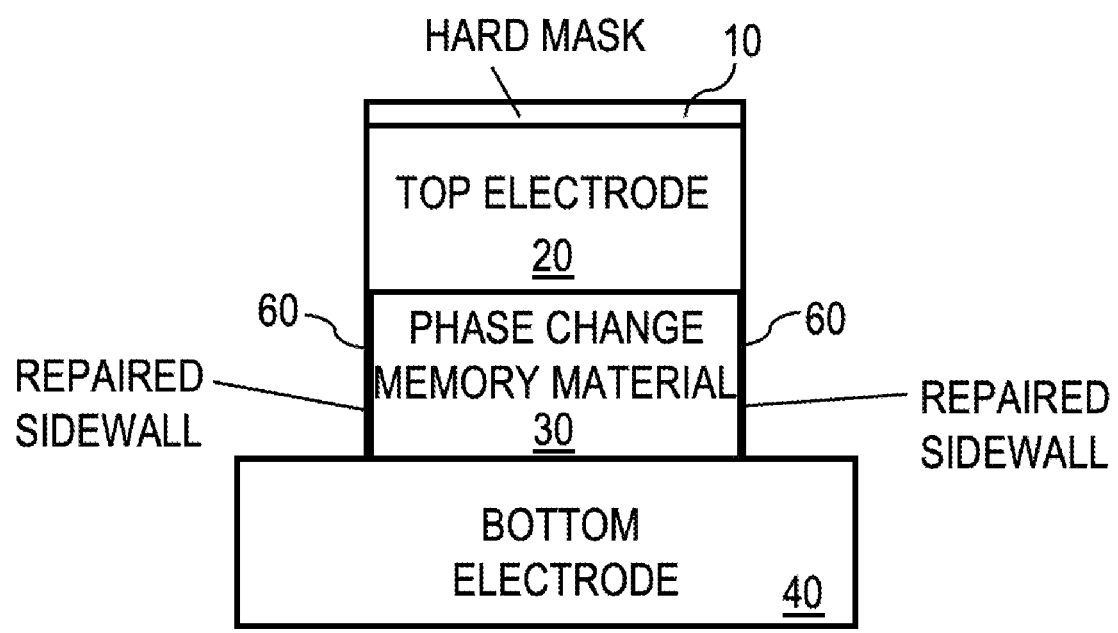
FIG. 4 is a diagram illustrating a repaired sidewall of a phase change memory (PCM) material layer after applying inert ion beam etching, in accordance with one embodiment of the present invention.

FIG. 4 is a diagram illustrating repaired sidewall 60 of the layer of phase change memory (PCM) material layer 30 after applying inert ion beam etching (IBE), in accordance with one embodiment of the present invention. The inert ion beam etching to trim the RIE-damaged sidewall layer allows elemental composition of the PCM/OTS bulk and elemental composition of the sidewall to be maintained. The inert ion beam etching to trim the RIE-damaged sidewall layer removes sputter redeposition caused by the previous RIE process and reduces critical dimension. The inert ion beam etching to trim the RIE-damaged sidewall layer helps remove metal redeposition (e.g., tungsten (W)) from the bottom electrode; the metal redeposition may short across the PCM/OTS. The inert ion beam etching to trim the RIE-damaged sidewall layer prevents intermixing between PCM and OTS and improves adhesion of encapsulation.

Having described embodiments of applying the inert ion beam etching for improving a profile and repairing sidewall damage for phase change memory devices, it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A process comprising:
    providing a stack comprising a bottom electrode, phase change memory material, a top electrode, and a hard mask;
    reactive ion etching, using halogens, the phase change memory material unprotected by the hard mask, wherein a sidewall of the phase change memory material is damaged by the reactive ion etching, using the halogens; and
    applying inert ion beam etching to trim the sidewall of the phase change memory material, wherein:
    the inert ion beam etching is with energy of 60 to 200 volts;
    applying the inert ion beam etching is at a temperature of 25 degrees Celsius to 250 degrees Celsius; and
    applying the inert ion beam etching is at an angle between an inert ion beam and a surface tangent of the sidewall of the phase change memory material, wherein the angle is at most 10 degrees.

2. The process of claim 1, wherein an argon ion beam is used in the inert ion beam etching to trim the sidewall.

3. The process of claim 1, wherein a neon ion beam is used in the inert ion beam etching to trim the sidewall.

4. The process of claim 1, wherein a krypton ion beam is used in the inert ion beam etching to trim the sidewall.

5. The process of claim 1, wherein a xenon ion beam is used in the inert ion beam etching to trim the sidewall.

6. The process of claim 1, wherein the angle is substantially 10 degrees.

7. The process of claim 1, wherein the angle is substantially less than 10 degrees.

8. The process of claim 1, wherein the phase change memory material is germanium-antimony-tellurium.

9. The process of claim 1, wherein the phase change memory material is silicon oxide doped germanium-antimony-tellurium.

10. The process of claim 1, wherein the phase change memory material is nitrogen doped germanium-antimony-tellurium.

11. The process of claim 1, wherein the phase change memory material is silicon oxide doped gallium-antimony-germanium.

12. The process of claim 1, wherein the inert ion beam etching removes sputter redeposition from the reactive ion etching.

13. The process of claim 1, wherein the inert ion beam etching removes metal redeposition from the reactive ion etching.

14. A phase change memory device comprising:
    a bottom electrode;
    a top electrode;
    a layer of phase change memory material between the bottom electrode and the top electrode; and
    a repaired sidewall present on sidewalls of the phase change memory material, the repaired sidewall resulting from applying inert ion beam etching to trim a damaged sidewall of the phase change memory material, wherein:
        the damaged sidewall generated in response to reactive ion etching using halogens;
        in the repaired sidewall, sputter redeposition from the reactive ion etching is removed by the inert ion beam etching; and
        in the repaired sidewall, metal redeposition from the reactive ion etching is removed by the inert ion beam etching.

15. The phase change memory device of claim 14, wherein the phase change memory material is selected from the group consisting of germanium-antimony-tellurium, silicon oxide doped germanium-antimony-tellurium, and nitrogen doped germanium-antimony-tellurium.

16. The phase change memory device of claim 14, wherein the phase change memory material is silicon oxide doped gallium-antimony-germanium.

17. The phase change memory device of claim 14, wherein the inert ion beam is selected from the group consisting of: an argon ion beam, a neon ion beam, a krypton ion beam, and a xenon ion beam.

18. The phase change memory device of claim 14, further comprising a hard mask on the top electrode.

* * * * *